United States Patent [19]

Jouanny

[11] Patent Number: 4,636,917

[45] Date of Patent: Jan. 13, 1987

[54] PRECALIBRATED ELEMENT FOR SECURING AND LOCKING SEMICONDUCTORS AND HEAT SINKS ARRANGED IN ALTERNATING ROWS

[75] Inventor: Robert Jouanny, Montreuil Sous Bois, France

[73] Assignee: Jeumont-Schneider Corporation, Puteaux, France

[21] Appl. No.: 640,394

[22] Filed: Aug. 13, 1984

[30] Foreign Application Priority Data

Aug. 19, 1983 [FR] France ................................ 83.13475

[51] Int. Cl.⁴ ............................................. H05K 7/20
[52] U.S. Cl. ..................................... 361/388; 357/79; 357/81; 361/383
[58] Field of Search .................................. 357/79, 81; 361/386–389

[56] References Cited

U.S. PATENT DOCUMENTS

| 3,523,215 | 8/1970 | Steinmetz, Jr. et al. | 361/388 |
| 3,864,607 | 2/1975 | Phillips | 361/383 |
| 3,943,426 | 3/1976 | Thiele et al. | 357/81 |

FOREIGN PATENT DOCUMENTS 2415514  8/1979 France .
8211371A 6/1982 France .
0116638  9/1979 Japan ................................... 357/79

Primary Examiner—A. D. Pellinen
Assistant Examiner—Gregory D. Thompson
Attorney, Agent, or Firm—Rines and Rines; Shapiro and Shapiro

[57] ABSTRACT

In electrical apparatus of the type having a column of stacked semiconductors and interposed heat sinks mounted between a pair of end plates, a precalibrated clamping element is provided for applying a predetermined clamping force to one end of the column to secure the column between the end plates. A hollow cylindrical body of the clamping element threads into one of the end plates and houses a spring which has been placed in precalibrated compression by a press. The spring is retained in a precalibrated state between a shoulder portion of a piston within the body and a fixed inner surface of the body. A cap is secured to an end of the body and is positioned to abut the shoulder to retain the spring in the precalibrated state. To apply the predetermined force to the column, the cylindrical body is threaded toward the second end plate with a head portion of the piston supporting the column to achieve a specific positional relationship between the body and the piston in which the spring exerts the predetermined force on the piston shoulder.

22 Claims, 2 Drawing Figures

PRECALIBRATED ELEMENT FOR SECURING AND LOCKING SEMICONDUCTORS AND HEAT SINKS ARRANGED IN ALTERNATING ROWS

BACKGROUND OF THE INVENTION

The present invention pertains to the mounting of an assembly composed of semiconductors (such as thyristors, transistors or diodes) and heat sinks stacked alternately upon one another between two plates which are to be fastened by means of threaded rods, with the aforementioned heat sinks serving not only to ensure removal of heat, but to provide connections with the surfaces of the aforementioned semiconductors.

In more specific terms, the present invention pertains to a means of clamping and securely positioning an assembly composed of electrical semiconductors and heat sinks of the previously indicated type, which is simple to use, while also reliably ensuring the level of clamping force applied to the assembly.

The present invention is particularly applicable for mounting semiconductors for traction equipment intended for shipping, wherein minimization of overall dimensions is of prime importance.

French Patent Application No. 82 11371, which was submitted on June 29, 1982, discloses one technique to accomplish high-pressure locking of a column of alternately stacked semiconductors and heat sinks between two plates fastened by means of threaded rods. This technique involves the use of a screw which extends axially through one of said plates, so as to apply the required clamping pressure to the stacked elements from a point located along the axis of the column.

In this particular instance, tightening torque is applied by means of a dynamometric wrench, in order to transmit clamping pressure with maximum precision.

It is also possible to accomplish the same result with the previously cited assembly by applying clamping pressure axially to the column through the threaded rods which fasten the plates together, by employing a clamping press of the type described in French Pat. No. 2,415,514. These methods are effective and satisfactory, but since it is necessary to apply clamping pressure directly to the aforementioned assembly with the use of either a press or a dynamo-metric wrench, considerable precision is required.

SUMMARY OF THE INVENTION

The present invention is intended to overcome these drawbacks. Accordingly, the axial clamping screw cited within the aforementioned patent application (No. 82 11371) is replaced by a precalibrated clamping element in accordance with the invention. The clamping element of the invention is precalibrated with a press prior to being fitted onto a mounting plate, so as to ensure perfect positioning and suitable locking of a semiconductor column, without any need to make use of a dynamometric wrench.

BRIEF DESCRIPTION OF THE DRAWINGS

An exemplary embodiment of the present invention shall be described hereinafter, without any intention of restricting the scope of said invention. Reference shall be made to accompanying drawings, wherein.

DESCRIPTION OF THE PREFERRED EMBODIMENT

Figure 1:
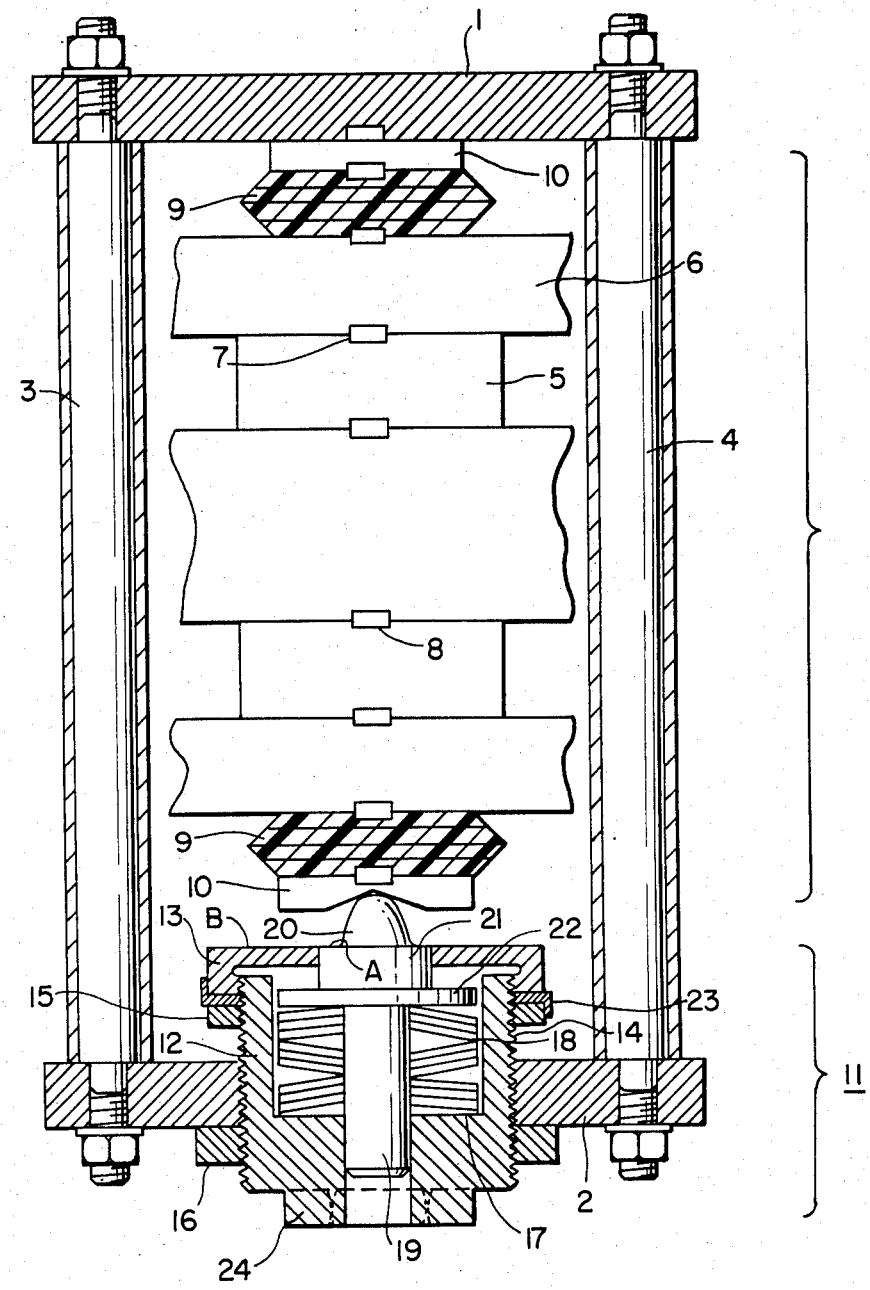
FIG. 1 is a sectional view of a mounting assembly for a stacked semiconductor column showing such a column supported on a precalibrated clamping element according to the invention.

Within FIG. 1, the reference numerals 1 and 2 respectively designate plates secured by means of threaded rods, 3 and 4, which form crosspieces. A column of stacked semiconductor housings 5 with heat sinks 6 disposed between successive housings 5 is mounted between these plates.

The semiconductor housings 5 and heat sinks 6 are aligned by means of plugs 7 inserted into respective openings 8 provided within the aforementioned housings 5 and heat sinks 6. Insulating elements 9 and washers 10 support opposite ends of the stacked column of semiconductors and heat sinks, as shown in FIG. 1. The reference numeral 11 comprehensively designates the precalibrated clamping element for securing and locking the entire column assembly in accordance with the present invention. The reference numerals 12 through 24 within FIGS. 1 and 2 correspond to identical items.

In the form shown, the precalibrated element 11 includes a hollow cylindrical member 12 which is sealed with a cap nut 13. In this particular example, the outer wall 14 of the member 12 is threaded so as to accommodate a locking nut 15 for the cap 13 and a locking nut 16 for the plate 2. The inner portion of member 12 has been machined so as to accommodate flexible washers 17, as well as a sliding piece 18 constituting a piston. Sliding piece 18 has a bottom tip portion 19 which extends into an opening in a bottom wall of member 12, as shown, the opening forming a slide type guide for the piece 18. The opposite end of sliding piece 18 has a head 20 which possesses the shape of a spherical cap in this particular example. The head 20 constitutes a supporting element for a washer 10 situated at the bottom of stacked column arrangement shown within FIG. 1. A ring 21 is disposed beneath the head 20 on sliding piece 18, and a shoulder 22 is situated beneath said ring 21. The ring 21 is slidably received in an opening in the cap nut 13, as shown. As is most easily seen in FIG. 2, one side of shoulder 22 is in contact with the cap 13, whereas the other side of the shoulder rests upon the stack of washers 17. A locking nut 23 is provided to join cap 13 and locking nut 15 together as a unit after they have been securely positioned. Lastly, the bottom 24 of the cylindrical member 12 forms a hexagonal nut, in order to permit use of a wrench for firmly securing the precalibrated clamping element 11 to the plate.

It is now appropriate to describe how precalibration of clamping element 11 is accomplished and to describe procedures for mounting a stacked column of semiconductors and heat sinks using the clamping element 11.

Figure 2:
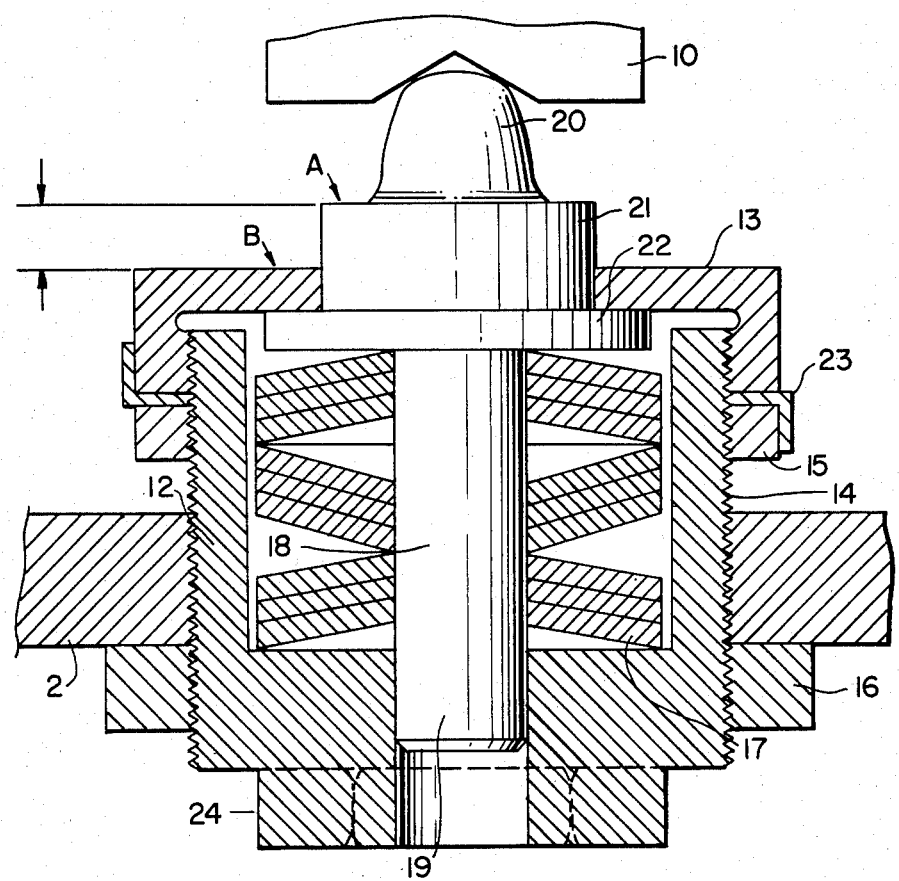
FIG. 2 is an enlarged sectional view showing the clamping element of FIG. 1.

To precalibrate element 11, the force which the set of washers 17 shall apply to the movable sliding piece 18 is set as follows:

(1) When the washers and the sliding piece have been mounted within the hollow cylindrical member 12, the cap 13 is screwed into place until it is in contact with the shoulder 22 (FIG. 2).

(2) The element 11 is then placed upon a pressing bed, and the necessary compression of the aforementioned washers is obtained when the press applies a predetermined pressure to the head 20. The washers 17 bend under this load. While pressure is maintained, the cap 13 is screwed further onto member 12 until a surface B of member 12 is situated at the same level as a surface A on the ring 21. When these respective positions of surfaces A and B have been attained, the nut 15 is secured against the cap 13, and the locking nut 23 is fitted on the cap 13 and nut 15 in order to hold them in place.

(3) Subsequently, the pressure furnished by the press is eliminated, and the sliding piece 18 is pushed by the washers 17 until the uppermost surface of the shoulder 22 rests against the corresponding surface (the inner surface) of the cap 13. Thus, precalibration is definitively established and clamping element 11 is ready for use.

Referring to FIG. 1, the stacked column of semiconductors 5 and heat sinks 6 may be mounted between plates 1 and 2 using clamping element 11 as will now be described. Initially, the precalibrated element 11 is threaded the maximum distance into plate 2 (downward in FIG. 1). Next, the column of stacked components is placed between plate 1 and head 20 of sliding piece 18. A standard wrench is then applied to bottom 24 of cylindrical member 12 to thread member 12 upward toward bottom washer 10. As member 12 moves upward, head 20 presses against bottom washer 10 so that member 12 moves up along sliding piece 18, thereby compressing washers 17 between the shoulder 22 and the bottom interior wall of member 12. Rotation by the wrench is continued until surface B of member 12 is level with surface A of ring 21, as shown in FIG. 1. In this condition, washers 17 exert the precalibrated clamping force against shoulder 22, thus providing the desired clamping force to the stacked column via head 20. The locking nut 16 may then be secured on member 12, as shown, to prevent rotation of member 12 and thereby lock the clamping element 11 in place.

The advantages which this invention offers are clearly apparent from the preceding description. Furthermore, the arrangement which has been adopted for the clamping element makes it possible to use this element several times without a need for recalibration. This aspect is extremely advantageous in terms of replacing semiconductors in locations other than an assembly shop.

In addition, the invention makes it possible to lock a stacked semiconductor column into place with standard wrenches, and the presence of a large diameter item with fine-pitched threading makes it possible to achieve a substantial reduction in the required tightening torque.

Lastly, it is also possible to mount the clamping element designed in accordance with the present invention within or outside a compartment containing a heat-conveying fluid, in order to ensure secure positioning of semiconductors which are cooled by circulation of a fluid or by air.

It should be understood that the present invention is not restricted to the embodiment which has been described as an example; hence, any modifications introduced by technically knowledgeable persons would not constitute departures from the context of said invention. For example, it is possible for the outer wall of the cylindrical member identified as 12 to be unthreaded, with this member being fastened to the plate 2 by any appropriate means and with the cap 13 being held in place at the desired height by any appropriate clamping arrangement developed heretofore.

I claim:

1. For use in mounting a column of stacked semiconductors with interposed heat sinks endwise between a pair of end plates joined by cross pieces, a precalibrated clamping element for applying a predetermined clamping force to one end of the column, said clamping element comprising a hollow cylindrical member constructed to be inserted axially through an opening in one of said end plates; a cap secured over an open end of said cylindrical member to be disposed between said end plates; piston means movable axially of said cylindrical member and having a first portion projecting through an opening in said cap and a second portion disposed within said cylindrical member, said first portion including a head with a support surface for supporting said one end of said column, said second portion including shoulder means disposed to abut an inner surface of said cap; and spring means supported within said cylindrical member against a fixed inner surface thereof and supporting said shoulder means of said piston means and urging said shoulder means toward said inner surface of said cap, said spring means being precalibrated to exert a predetermined force against said shoulder means when said cylindrical member is disposed in a specific position relative to said piston means with said column supported on said support surface, said cap being secured on said cylindrical member in a position such that said spring means is retained in a precalibrated state compressed between said fixed inner surface and said shoulder means.

2. A clamping element in accordance with claim 1, further including means indicating when said cylindrical member is disposed in said specific position relative to said piston means.

3. A clamping element in accordance with claim 2, wherein said indicating means includes a surface of said piston means and a surface of said cap, said surfaces being disposed to align with one another when said cylindrical member is at said specific position.

4. A clamping element in accordance with claim 3, wherein said piston means includes a ring disposed between said head portion and said shoulder means and slidable in said opening of said cap and wherein said surface of said piston means is a surface of said ring adjacent said head portion of said piston means and wherein said surface of said cap is an outer surface of said cap transverse to the axis of said cylindrical member.

5. A clamping element in accordance with claim 1, wherein said cylindrical member has a threaded outer surface which is threadably engageable with said opening of said one end plate.

6. A clamping element in accordance with claim 5, wherein said cap is threaded to said outer surface of said cylindrical member.

7. A clamping element in accordance with claim 5, wherein an end of said cylindrical member opposite said cap has a portion for cooperation with a wrench.

8. A clamping element in accordance with claim 5, further including a nut threaded on said cylindrical member rearward of said cap and locking nut means disposed intermediate said nut and said cap and locking said nut and said cap together as a unit.

9. A clamping element in accordance with claim 8, including additional locking nut means threadable onto said cylindrical member and locking said cylindrical member against rotation relative to said one end plate.

10. A clamping element in accordance with claim 1, wherein said spring means includes flexible washer means supported on said fixed inner surface of said cylindrical member and compressible between that surface and said shoulder means.

11. A clamping element in accordance with claim 1, wherein said piston means has a rear portion opposite said head portion which is slidably received by a guide means of said cylindrical member.

12. In electronic apparatus of the type having a column of stacked semiconductor devices with heat sinks interposed between successive semiconductor devices, the column being supported endwise between a first end plate and a second end plate joined by cross pieces, a precalibrated clamping element applying a predetermined clamping force to one end of said column to secure said column between said end plates, said precalibrated clamping element comprising a hollow cylindrical member axially inserted in an opening of said first end plate; a cap secured over an open end of said cylindrical member facing said second end plate; piston means movable axially of said cylinder and having a first portion projecting out of said cylindrical member toward said second plate through an opening in said cap and having shoulder means disposed within said cylindrical member and in abutment with an inner surface of said cap, said projecting portion having a support surface supporting said column; and spring means supported within said cylindrical member against a fixed inner surface thereof and supporting said shoulder means and urging said piston means toward said second end plate, said spring means being precalibrated to exert said predetermined force on said shoulder means in the direction of said second plate when said cylindrical member is disposed in a specific position relative to said piston means with said column supported on said support surface of said piston means, said cap being secured on said cylindrical member in such a position that said spring means is retained in a precalibrated state compressed between said fixed inner surface and said shoulder means.

13. A clamping element in accordance with claim 12, further including means indicating when said cylindrical member is disposed in said specific position relative to said piston means.

14. A clamping element in accordance with claim 13, wherein said indicating means includes a surface of said piston means and a surface of said cap, said surfaces being disposed to align with one another when said cylindrical member is at said specific position.

15. A clamping element in accordance with claim 14, wherein said piston means includes a ring disposed between said head portion and said shoulder means and slidable in said opening of said cap and wherein said surface of said piston means is a surface of said ring adjacent said head portion of said piston means and wherein said surface of said cap is an outer surface of said cap transverse to the axis of said cylindrical member.

16. A clamping element in accordance with claim 12, wherein said cylindrical member has a threaded outer surface which is threadably engageable with said opening of said one end plate.

17. A clamping element in accordance with claim 16, wherein said cap is threaded to said outer surface of said cylindrical member.

18. A clamping element in accordance with claim 16, wherein an end of said cylindrical member opposite said cap has a portion for cooperation with a wrench.

19. A clamping element in accordance with claim 16, further including a nut threaded on said cylindrical member rearward of said cap and locking nut means disposed intermediate said nut and said cap and locking said nut and said cap together as a unit.

20. A clamping element in accordance with claim 19, including additional locking nut means threadable onto said cylindrical member and locking said cylindrical member against rotation relative to said one end plate.

21. A clamping element in accordance with claim 12, wherein said spring means includes flexible washer means supported on said fixed surface of said cylindrical member and compressible between that surface and said shoulder means.

22. A clamping element in accordance with claim 12, wherein said piston means has a rear portion opposite said heat portion which is slidably received by a guide means of said cylindrical member.

* * * * *